(12) United States Patent
Sasaki et al.

(10) Patent No.: US 7,456,085 B2
(45) Date of Patent: Nov. 25, 2008

(54) METHOD FOR INTRODUCING IMPURITIES

(75) Inventors: Yuichiro Sasaki, Tokyo (JP); Tomohiro Okumura, Osaka (JP); Bunji Mizuno, Nara (JP); Cheng-Guo Jin, Kanagawa (JP); Ichiro Nakayama, Osaka (JP); Satoshi Maeshima, Hyogo (JP); Katsumi Okashita, Tokyo (JP)

(73) Assignee: Panasonic Corporation, Osaka (JP)

( * ) Notice: Subject to any disclaimer, the term of this patent is extended or adjusted under 35 U.S.C. 154(b) by 349 days.

(21) Appl. No.: 10/597,716

(22) PCT Filed: Feb. 4, 2005

(86) PCT No.: PCT/JP2005/001706

§ 371 (c)(1),
(2), (4) Date: Aug. 4, 2006

(87) PCT Pub. No.: WO2005/076328

PCT Pub. Date: Aug. 18, 2005

(65) Prior Publication Data

US 2008/0146009 A1    Jun. 19, 2008

(30) Foreign Application Priority Data

Feb. 6, 2004   (JP) .............................. 2004-031174

(51) Int. Cl.
  *H01L 21/26* (2006.01)
  *H01L 21/42* (2006.01)
(52) U.S. Cl. ........................ 438/513; 438/514; 438/510; 257/E21.135
(58) Field of Classification Search .................. 438/513, 438/514, 510; 257/E21.135
See application file for complete search history.

(56) References Cited

U.S. PATENT DOCUMENTS 5,258,319 A * 11/1993 Inuishi et al. ............... 438/286

(Continued)

FOREIGN PATENT DOCUMENTS

JP          9-102465         4/1997

(Continued)

OTHER PUBLICATIONS

Talwat et al., "Study of Thermal Processing (LTP) to Meet Sub 130 nm Node Shallow Junction Requirements", 2002, pp. 175-177.

(Continued)

*Primary Examiner*—Phat X. Cao
*Assistant Examiner*—Nga Doan
(74) *Attorney, Agent, or Firm*—Pearne & Gordon LLP

(57) ABSTRACT

To provide an impurity introducing method which can repeatedly carry out such a process that plasma irradiation for realization of amorphous and plasma doping were combined, in such a situation that steps are simple and through-put is high, without destroying an apparatus.

At the time of switching over plasmas which are used in plasma irradiation for realization of amorphous and plasma doping, electric discharge is stopped, and an initial condition of a matching point of a high frequency power supply and a peripheral circuit is reset so as to adapt to plasma which is used in each step, or at the time of switching, a load, which is applied to the high frequency power supply etc., is reduced by increasing pressure and decreasing a bias voltage.

10 Claims, 2 Drawing Sheets

U.S. PATENT DOCUMENTS 6,440,825 B1 * 8/2002 Gonzalez et al. ............ 438/525
6,482,724 B1 * 11/2002 Chatterjee ................... 438/525
6,982,215 B1 * 1/2006 Lee et al. .................... 438/514

FOREIGN PATENT DOCUMENTS

JP 3054123 4/2000

OTHER PUBLICATIONS

Ito et al., "Flash Lamp Annealing Technology for Ultra-shallow Junction Formation", Extended Abstracts of International Workshop on Junction Technology, 2002, pp. 23-26.

Kagawa et al., "Influence of pulse duration on KrF excimer laser annealing process for ultra shallow junction formation", Extended Abstracts of International Workshop on Junction Technology, 2002, pp. 31-34.

Yamamoto et al., Impact of Pre-Amorphization for the Reduction of Contact Resistance Using Laser Thermal Process, Extended Abstracts of International Workshop on Junction Technology, 2002, pp. 27-30.

Ito et al., "Improvement of Threshold Voltage Roll-off by Ultra-shallow Junction Formed by Flash Lamp Annealing", Symposium on VLSI Technology Digest of Technical Papers, 2003.

* cited by examiner

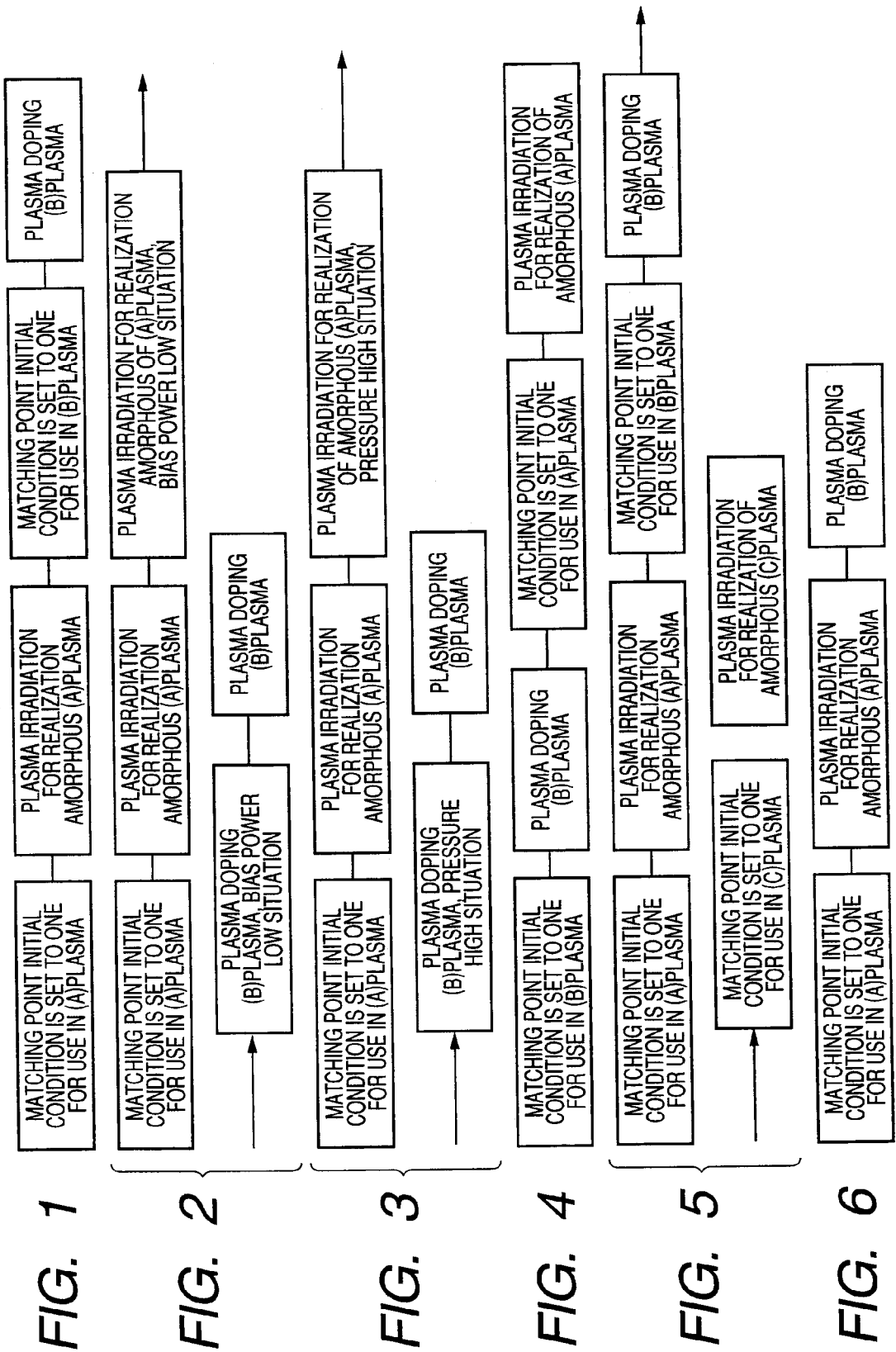

METHOD FOR INTRODUCING IMPURITIES

TECHNICAL FIELD

This invention relates to a method of introducing impurities, and more particularly, relates to a method of forming a junction for forming an electronic element on a semiconductor substrate, and a method of forming a junction for forming an electronic element on such a substrate that a semiconductor thin film is formed on an insulating substrate surface which is used for a liquid crystal panel etc.

BACKGROUND ART

For example, on the occasion of forming an element region on a semiconductor substrate, a lot of pn junctions are used. In addition, such a SOI (silicon on insulator) substrate that a silicon thin film is formed on a substrate surface through an insulating film is widely used for various semiconductor devices such as DRAM. In addition, such a glass substrate that a semiconductor thin film is formed on a substrate surface attracts attention with planning for miniaturization and realization of high speed of a liquid crystal panel by integrating a liquid crystal drive circuit including thin film transistors (TFTs) in this semiconductor thin film.

On the occasion of forming various semiconductor devices in this manner, pn junctions are used. As the suchlike method of forming pn junctions, a method of introducing p type impurities such as boron by ion implantation into a n type silicon substrate and thereafter, electrically activating them by a halogen lamp, is used conventionally.

For example, as a method of introducing boron which is a p type impurity, plasma doping is expected as a next generation method which can introduce particles effectively with very low energy, in addition to ion implantation.

As a method of electrically activating introduced ions such as boron ions, a method of irradiating xenon flash lamp light, all solid-state laser light, and excimer laser right, other than halogen lamp light, and the like have been researched and developed.

Here, a method of forming a shallow activated layer by utilizing a difference of optical absorption coefficients of silicon crystal and amorphous silicon has been proposed. In sum, an optical absorption coefficient of amorphous silicon is larger as compared with that of silicon crystal, in a wavelength range of 375 nm or more. Then, for example, an amorphous layer is formed in advance on a silicon substrate surface prior to irradiating light, and after that, light is irradiated, and thereby, a lot of light energy is let absorbed by the amorphous layer, to form a shallow activated layer. In these reports, it is general that realization of pre-amorphous of a substrate surface is carried out, prior to introduction of impurities, and after that, impurities are introduced. Ion implantation of germanium and silicon is used for the realization of pre-amorphous (see, Non-Patent Documents 1, 2, 3, 4, 5 and Patent Document 1).

In recent days, such a process that changing a silicon very shallow layer to amorphous by use of plasma, and plasma doping were combined, has been proposed by inventors of this case. According to this, plasma such as helium is irradiated to a silicon substrate by use of a plasma irradiation apparatus, and thereby, amorphous of a very shallow layer on a silicon surface can be realized. Further, plasma doping is carried out by plasma of gas including boron through the use of the same apparatus, and thereby, very low impurity introduction can be carried out. In this method, low energy plasma is used, and therefore, there is such an advantage that it is possible to realize amorphous of a very low region effectively, as compared with ion implantation. Further, by using it with plasma doping at the same time, it is possible to easily form a very low impurity layer which is changed to amorphous, by 1 unit of the apparatus.

Non-Patent Document 1: Ext. Abstr. Of IWJT, pp23-26, Tokyo, 2002.
Non-Patent Document 2: Symposium on VLSI Technology Digest of Technical Papers, pp 53-54, Kyoto, 2003.
Non-Patent Document 3: Ext. Abstr. Of IWJT, pp31-34, Tokyo, 2002.
Non-Patent Document 4: Ext. Abstr. Of IWJT, pp27-28, Tokyo, 2002.
Non-Patent Document 5: 2000 International Conference on Ion Implantation Technology Proceedings, 2000, pp.175-177.
Patent Document 1: U.S. Pat. No. 3,054,123 (P3054123)

DISCLOSURE OF THE INVENTION

<Problem that the Invention is to Solve>

In such a process that changing to a silicon very shallow layer to amorphous by use of plasma, and plasma doping were combined, it is desirable to realize changing to amorphous and plasma doping in the same chamber, from viewpoints of anti-oxidation and anti-pollution of a surface.

In addition, also in the aspect of the apparatus, in case of separating processes and carrying out them by separate plasma irradiation apparatuses, a plurality of chambers are required, and time, which is required for delivery between chambers, becomes necessary, and from that viewpoint, there is such a problem that it is not effective.

Then, various experiments were made repeatedly as to an apparatus which realizes such a process that changing a silicon very shallow layer to amorphous by use of plasma, and plasma doping were combined, in the same chamber. In consequence, in the conduct of experiments, it was found that there occurs breakage in a power supply and a peripheral circuit of a plasma introduction apparatus at the time of switching over plasmas which are used in both processes.

Furthermore, it was recognized that its cause is because matching points of a high frequency power supply and a peripheral circuit, as bias application means and a plasma source are different since different kinds of plasmas are used continuously in a process of continuously carrying out a change to amorphous and plasma doping, and a load is applied at the time of switching over plasma.

In this manner, in case of realizing a change to amorphous and plasma doping in the same chamber, there was such a problem that a load is applied to a high frequency power supply or its peripheral circuit as bias application means and a plasma source, at the time of switching over plasmas, and an apparatus is damaged easily.

In the suchlike situation, provision of method which does not provoke breakage of a high frequency generation source or its peripheral circuit, at the time of switching over plasma which is used for a change to amorphous, and plasma which is used for plasma doping, without substantially dropping down efficiency of an entire process and investment efficiency to the apparatus, has been requested.

The present invention is made in view of the above-described actual condition, and aims to provide a method which can realize a change of a silicon very shallow layer to amorphous by use of plasma, and plasma doping in the same chamber, without inviting breakage of the apparatus.

<Means for Solving the Problem>

Then, in a method of the present invention, electric discharge is stopped at the time of switching over plasmas between processes of plasma irradiation for realization of amorphous and plasma doping, and an initial condition of a high frequency power supply as a plasma application or plasma source, or an initial condition of a matching point of a matching circuit is re-set up, so as to adapt to plasma which is used in each process.

An impurity introducing method of the present invention includes a first plasma irradiation step of carrying out plasma irradiation for realization of amorphous in which a surface of a semiconductor substrate is changed to an amorphous situation, and a second plasma irradiation step of carrying out plasma doping impurities so as to form a shallow junction in the semiconductor substrate, and includes a resetting step of resetting a plasma irradiation condition, on the occasion of shifting from the first plasma irradiation step to the second plasma irradiation step.

By this method, it is possible to prevent an extra load from being applied to an apparatus, and effective use becomes possible, and therefore, it is possible to prevent breakage of the apparatus from being provoked.

In addition, in the impurity introducing method of the present invention, the resetting step includes a step of resetting an initial condition of a plasma generation source so as to adapt to plasma which is used in each step.

By this method, it is possible to easily provide an appropriate plasma situation.

In addition, in the impurity introducing method of the present invention, the resetting step includes a step of resetting an initial condition of a matching point of a matching circuit so as to adapt to plasma which is used in each step.

By this method, the matching circuit is set up to a matching situation right after plasma irradiation start, and therefore, it is possible to prevent an extra load from being applied to the apparatus.

In addition, in the impurity introducing method of the present invention, the resetting step includes a step of stopping electric discharge once and then, resetting it, on the occasion of shifting from the first plasma irradiation step to the second plasma irradiation step.

There is such a case that a large electric current flows at the time of switching, but by stopping electric discharge once, it is possible to prevent failure of a high frequency power supply due to matching fault of a matching circuit.

In addition, in the impurity introducing method of the present invention, the resetting step includes a step of decreasing and changing bias power and thereafter, applying desired bias power, on the occasion of shifting from the first plasma irradiation step to the second plasma irradiation step.

By this method, there is such a case that a large electric current flows at the time of switching, but since it is configured so as to lower and change bias power and thereafter, to apply desired bias power, it is possible to prevent failure of a high frequency power supply due to matching fault of a matching circuit. It is desirable to lower bias power at the time of plasma switching, to 5-50% of bias power to be applied after switching. More desirably, it is lowered to 5-30%. If it is 50% or more, an advantage is low. On the one hand, if bias power is lowered too much, it is not possible to make reflected waves zero.

In addition, in the impurity introducing method of the present invention, the resetting step includes a step includes one of decreasing pressure and changing other conditions except pressure, and thereafter, setting desired pressure, on the occasion of shifting from the first plasma irradiation step to the second plasma irradiation step.

By resetting conditions in such a situation that pressure was lowered, it is possible to shift to the second plasma irradiation step while a matching circuit maintains a matching situation, and therefore, it is possible to prevent failure of a peripheral circuit and a high frequency power supply. Pressure at the time of plasma switching is set to 1.1-3.0 times of pressure which is set up after switching. If it is 1.1 times or less, there is no advantage. On the one hand, if pressure is increased to 3.0 times or more, it takes too much time for the process.

In addition, the impurity introducing method of the present invention includes a thing characterized in that the second plasma irradiation step is carried out after the first plasma irradiation step.

In this case, especially, there is a problem of failure due to increase of loads to a matching circuit and a high frequency power supply at the time of switching over the plasma irradiation steps, but by using this method, it is possible to prevent extra loads to the matching circuit and the high frequency power supply, and to provide an appropriate plasma situation in the second plasma irradiation step. By doing in this manner, it is possible to obtain such advantages that an advantage for changing to amorphous, i.e., an optical absorption rate at the time of annealing is improved, and to enable annealing at low temperature and an activation rate of impurities are improved, to realize low resistance. In this manner, a device at the time of switching plasmas in such a newly proposed process that plasma irradiation for realization of amorphous and plasma doping were combined, is very useful.

In addition, the impurity introducing method of the present invention includes a thing characterized in that the first plasma irradiation step is carried out after the second plasma irradiation step.

In this case, especially, there is a problem of failure due to increase of loads to a matching circuit and a high frequency power supply at the time of switching over the plasma irradiation steps, but by using this method, there is such an advantage that it is possible to prevent failure of a peripheral circuit and a high frequency power supply without applying extra loads to the matching circuit and the high frequency power supply. In this manner, in a device at the time of switching plasmas in combination of a step of carrying out plasma irradiation for realization of amorphous after plasma doping is carried out, so-called step including realization of amorphous as post-processing, the amorphous realization as post-processing may be realized by ion implantation.

In addition, the impurity introducing method of the present invention is configured in such a manner that the first plasma irradiation step is carried out prior to the second plasma irradiation step.

In this case, especially, there is a problem of failure due to increase of loads to a matching circuit and a high frequency power supply at the time of switching over the plasma irradiation steps, but by using this method, there is such an advantage that it is possible to prevent failure of a peripheral circuit and a high frequency power supply without applying extra loads to the matching circuit and the high frequency power supply.

In addition, in the impurity introducing method of the present invention, gas seed, which is used in the first plasma irradiation step, includes helium and neon.

It is conceivable that helium and neon are of low spattering efficiency, and it is possible to change them to amorphous without almost chipping off silicon, and it is more desirable.

In addition, in the impurity introducing method of the present invention, gas seed, which is used in the second plasma irradiation step, includes at least one of a group comprising Ar, Kr, Xe, and Rn.

Its reason is that these elements are rare gas, and have a characteristic of inertness.

In addition, there are a lot of reports in which $B_2H_6$, $BF_3$ are used as a gas seed which is used in plasma doping, and by combining with these plasma doping, it is applicable.

In this manner, it is possible to reduce a load which is applied to a high frequency power supply etc. at the time of switching of plasmas, and it is possible to carry out such a process that changing to a silicon very shallow layer to amorphous by use of plasma, and plasma doping were combined, effectively without provoking failure of an apparatus.

In addition, the impurity introducing method of the present invention is carried out by combination of steps selected from a group comprising combination of carrying out plasma doping after plasma irradiation for realization of amorphous was carried out, combination of carrying out plasma irradiation for realization of amorphous after plasma doping was carried out, and combination of carrying out plasma doping after plasma irradiation for realization of amorphous was carried out, and after that, of further carrying out plasma irradiation for realization of amorphous.

<Advantage of the Invention>

As explained above, in the present invention, a process is devised so as for a load not to be applied to a high frequency power supply and a circuit at the time of switching over plasmas, in such a process that changing a silicon very shallow layer to amorphous, and plasma doping were combined. That is, at the time of plasma switching, by stopping electric discharge and setting a matching point so as to adapt to each plasma, and by decreasing bias power and increasing pressure, it is possible to carry out the process without destroying a high frequency power supply and a peripheral circuit.

Therefore, it becomes possible to provide a method of forming a very shallow impurity introduced layer with a high optical absorption rate, over keeping through-put and investment efficiency to an apparatus, to a good level.

BRIEF DESCRIPTION OF THE DRAWINGS

FIG. 1 is a view which shows one example of a process in an embodiment of the present invention.

FIG. 2 is a view which shows one example of a process in an embodiment of the present invention.

FIG. 3 is a view which shows one example of a process in an embodiment of the present invention.

FIG. 4 is a view which shows one example of a process in an embodiment of the present invention.

FIG. 5 is a view which shows one example of a process in an embodiment of the present invention.

FIG. 6 is a view which shows one example of a process as a comparative example.

BEST MODE FOR CARRYING OUT THE INVENTION

Figure 7:
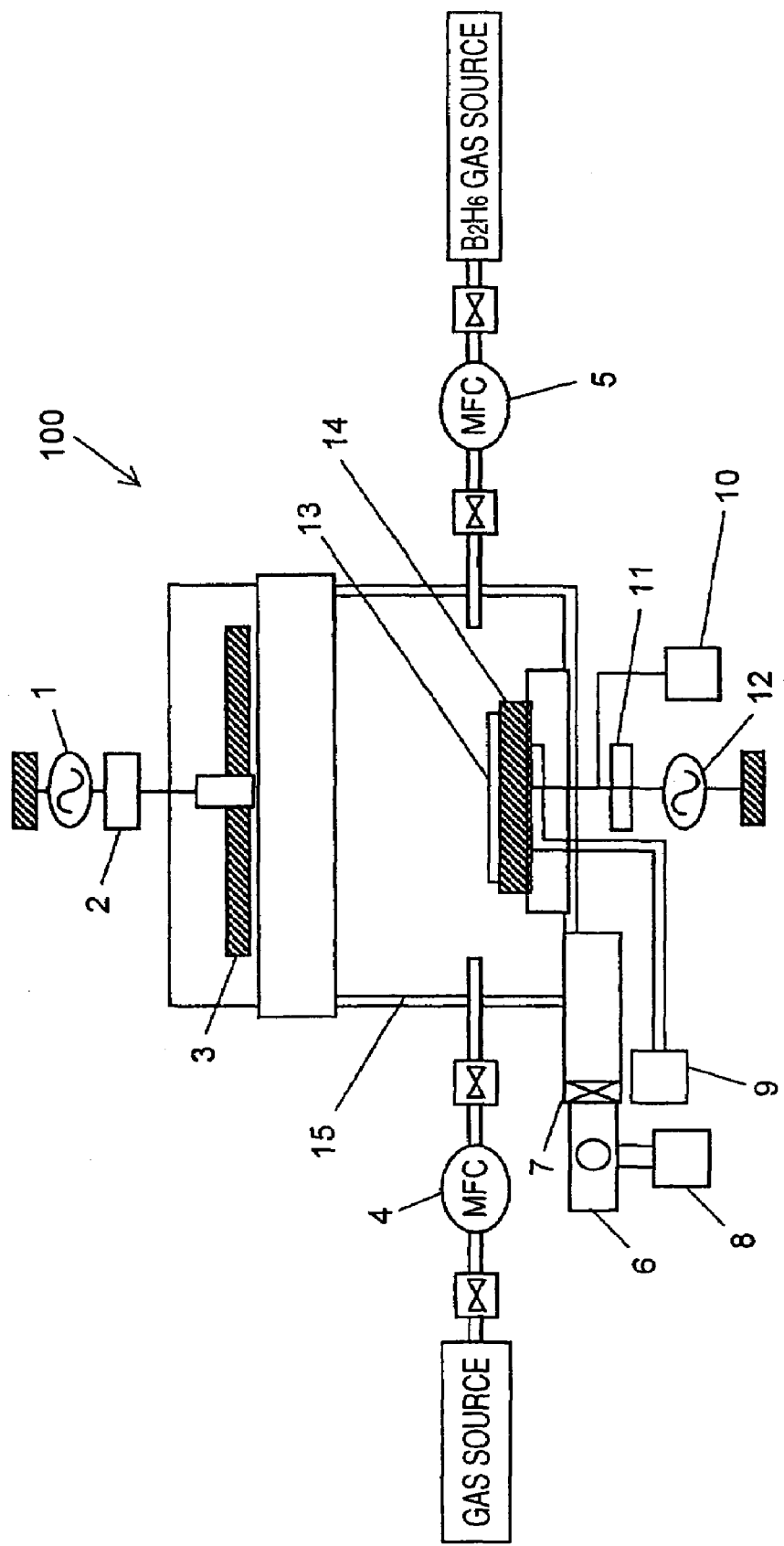
FIG. 7 is a view which shows an impurity introducing apparatus.

Next, an embodiment of the present invention will be explained.

Firstly, an apparatus, which is used in this embodiment, will be explained. In this regard, however, the present invention is not limited to the following apparatus.

This apparatus 100 has a high frequency power supply 1, a matching box 2, a coil and antenna 3, mass flow controllers 4 and 5, a turbo molecular pump 6, a conductance valve 7, a dry pump 8, a circulator 9, a DC power supply 10, a matching box 11, a high frequency power supply 12 and a lower electrode 14, and a base body to be processed 13 such as a silicon substrate is placed on the lower electrode 14 which is also used as a substrate mounting base.

Firstly, a silicon substrate 13 as a substrate to be processed, is conveyed into a process chamber 15, and thereafter, it is disposed on the lower electrode 14, and an introduction tube 16 of rage gas and an introduction tube 17 of diborane gas are connected to the process chamber 15 separately. The rage gas is a thing which is used for processing for changing a silicon substrate surface to amorphous by irradiating rage gas plasma. It is configured that a gas flow rate can be controlled by the mass flow controllers 4, 5, separately.

Meanwhile, in this embodiment, changing a surface of a solid base body itself to amorphous will be explained, but in this regard, however, the present invention is not limited to it, and it is needless to say that it is also applicable to a surface of a thin film which is formed on the solid base body.

Embodiment 1

FIG. 1 shows a flow chart of a method of an embodiment 1. In this embodiment 1, (A) plasma is used in plasma irradiation for realization of amorphous. In addition, (B) plasma is used in plasma doping. (A) plasma is He plasma, and pressure was set to 0.9 Pa, and bias power was set to 100 W. (B) plasma is plasma in which $B_2H_6$ gas is diluted with He gas, and pressure was set to 2.0 Pa, and bias power was set to 100 W.

In the beginning, an initial condition of a bias high frequency power supply was set up to a matching point for use in (A) plasma. After that, plasma was irradiated to a silicon substrate by use of (A) plasma, and it was changed to amorphous. After plasma irradiation was carried out only for predetermined time, plasma was stopped once. Then, an initial condition of the bias high frequency power supply was set up to a matching point for use in (B) plasma. After that, plasma doping was applied to the silicon substrate by use of (B) plasma.

Embodiment 2

FIG. 2 shows a flow chart of a method of an embodiment 2. In this embodiment 2, (A) plasma is used in plasma irradiation for realization of amorphous. In addition, (B) plasma is used in plasma doping. (A) plasma is He plasma, and pressure was set to 0.9 Pa, and bias power was set to 100 W. (B) plasma is plasma in which $B_2H_6$ gas is diluted with He gas, and pressure was set to 2.0 Pa, and bias power was set to 100 W.

In the beginning, an initial condition of a bias high frequency power supply was set up to a matching point for use in (A) plasma. After that, plasma was irradiated to a silicon substrate by use of (A) plasma, and it was changed to amorphous. After plasma irradiation was carried out only for predetermined time, bias power was lowered to 0 W. After that, a pressure adjustment value was squeezed, and $B_2H_6$ gas was introduced into the processing chamber to have pressure increased up to 2.0 Pa, and it was switched over to (B) plasma. After that, bias power is increased to 100 W, and plasma doping was carried out.

Embodiment 3

FIG. 3 shows a flow chart of a method of an embodiment 3. In this embodiment 3, (A) plasma is used in plasma irradiation for realization of amorphous. In addition, (B) plasma is used in plasma doping. (A) plasma is He plasma, and pressure was set to 0.9 Pa, and bias power was set to 100 W. (B) plasma is plasma in which $B_2H_6$ gas is diluted with He gas, and pressure was set to 2.0 Pa, and bias power was set to 100 W.

In the beginning, an initial condition of a bias high frequency power supply was set up to a matching point for use in (A) plasma. After that, plasma was irradiated to a silicon substrate by use of (A) plasma, and it was changed to amorphous. After plasma irradiation was carried out only for predetermined time, pressure was increased up to 2.5 Pa, and $B_2H_6$ gas was introduced into the process chamber, to switch to (B) plasma. After that, pressure was lowered down to 2.0 Pa, and plasma doping was carried out.

Embodiment 4

FIG. 4 shows a flow chart of a method of an embodiment 4. In this embodiment 4, (A) plasma is used in plasma irradiation for realization of amorphous. In addition, (B) plasma is used in plasma doping. (A) plasma is He plasma, and pressure was set to 0.9 Pa, and bias power was set to 100 W. (B) plasma is plasma in which $B_2H_6$ gas is diluted with He gas, and pressure was set to 2.0 Pa, and bias power was set to 100 W.

In the beginning, an initial condition of a bias high frequency power supply was set up to a matching point for use in (B) plasma. After that, plasma doping was applied to a silicon substrate by use of (B) plasma. After plasma doping was carried out only for predetermined time, plasma was stopped once. Then, an initial condition of the bias high frequency power supply was set up to a matching point for use in (A) plasma. After that, plasma irradiation for realization of amorphous was carried out by use of (A) plasma.

Embodiment 5

FIG. 5 shows a flow chart of a method of an embodiment 5. In this embodiment 5, (A) plasma is used in plasma irradiation for realization of amorphous prior to doping. In addition, (C) plasma is used in plasma irradiation for realization of amorphous after doping. Further, (B) plasma is used in plasma doping. (A) plasma is He plasma, and pressure was set to 0.9 Pa, and bias power was set to 100 W. In this embodiment 5, The same thing as (A) plasma is used as (C) plasma. In this regard, however, it is all right even if another condition is used. (B) plasma is plasma in which $B_2H_6$ gas is diluted with He gas, and pressure was set to 2.0 Pa, and bias power was set to 100 W.

In the beginning, an initial condition of a bias high frequency power supply was set up to a matching point for use in (A) plasma. After that, plasma was irradiated to a silicon substrate by use of (A) plasma, and it was changed to amorphous. After plasma irradiation was carried out only for predetermined time, plasma was stopped once. Then, an initial condition of the bias high frequency power supply was set up to a matching point for use in (B) plasma. After that, plasma doping was applied to the silicon substrate by use of (B) plasma. After plasma doping was carried out for predetermined time, plasma was stopped once. Then, an initial condition of the bias high frequency power supply was set up to a matching point for use in (C) plasma. Here, since the same thing as (A) plasma is used as (C) plasma, a matching point was set up to the same one. After that, plasma irradiation for realization of amorphous was carried out by use of (C) plasma.

By doing as shown in these embodiments 1 through 5, it became possible to carry out such a process that irradiation for realization of amorphous and plasma doping were combined, repeatedly, without destroying the bias high frequency power supply. By this means, it became possible to easily fabricate a very shallow impurity layer having a high optical absorption rate, without destroying the apparatus.

COMPARATIVE EXAMPLE

Next, a comparative example will be explained.

By use of FIG. 6, a difference of processes in the embodiments and the comparative example will be explained.

In the comparative example, (A) plasma is used in plasma irradiation for realization of amorphous, and (B) plasma is used in plasma doping. (A) plasma is He plasma, and pressure was set to 0.9 Pa, and bias power was set to 100 W. (B) plasma is plasma in which $B_2H_6$ gas is diluted with He gas, and pressure was set to 2.0 Pa, and bias power was set to 100 W.

In the comparative example, in the beginning, an initial condition of a bias high frequency power supply was set up to a matching point for use in (A) plasma. After that, plasma was irradiated to a silicon substrate by use of (A) plasma, and it was changed to amorphous. After plasma irradiation was carried out only for predetermined time, $B_2H_6$ gas was introduced into a process chamber, and pressure was adjusted to be set to 2.0 Pa, and plasma doping was applied to the silicon substrate by use of (B) plasma. Although it was tried to adjust a matching point of bias automatically at the time of switching of plasmas at this time, a load is applied to the bias high frequency power supply at an initial stage of starting adjustment, and the bias high frequency power supply breaks down often times. The number of faults was 3 times during a period of 6 months.

INDUSTRIAL APPLICABILITY

As explained above, according to the present invention, it is possible to repeatedly carry out such a process that plasma irradiation for realization of amorphous and plasma doping were combined, in such a situation that steps are simple and through-put is high, without destroying a bias high frequency power supply, and it is possible to easily fabricate a very shallow impurity layer having a high optical absorption rate, and therefore, it is useful for formation of a fine semiconductor integrated circuit.

The invention claimed is:

1. An impurity introducing method, including
   a first plasma irradiation step of carrying out plasma irradiation for realization of amorphous in which a surface of a semiconductor substrate is changed to an amorphous situation, and a second plasma irradiation step of carrying out plasma doping impurities so as to form a shallow junction in the semiconductor substrate, and
   including a resetting step of resetting a plasma irradiation condition, on the occasion of shifting from the first plasma irradiation step to the second plasma irradiation step,
   wherein the resetting step includes a step of resetting an initial condition of a platen RF power supply system so as to adapt to plasma which is used in each step.

2. The impurity introducing method as set forth in claim 1, wherein the resetting step includes a step of resetting an initial condition of a matching point of a matching circuit so as to adapt to plasma which is used in each step.

3. The impurity introducing method as set forth in claim 1, wherein the resetting step includes a step of electric discharge once and then, resetting it, on the occasion of shifting from the first plasma irradiation step to the second plasma irradiation step.

4. The impurity introducing method as set forth in claim 1, wherein the resetting step includes a step of decreasing bias power and thereafter, applying desired bias power, on the occasion of shifting from the first plasma irradiation step to the second plasma irradiation step.

5. The impurity introducing method as set forth in claim 1, wherein the resetting step includes a step of decreasing pressure and changing other conditions except pressure, and thereafter, setting desired pressure, on the occasion of shifting from the first plasma irradiation step to the second plasma irradiation step.

6. The impurity introducing method as set forth in claim 1, characterized in that the second plasma irradiation step is carried out after the first plasma irradiation step.

7. The impurity introducing method a set forth in claim 6, wherein it is configured in such a manner that the first plasma irradiation step is carried out after the second plasma irradiation step.

8. The impurity introducing method as set forth in claim 1, wherein it is configured in such a manner that the first plasma irradiation step is carried out prior to the second plasma irradiation step.

9. The impurity introducing method as set forth in claim 1, characterized in that gas seed, which is used in the first plasma irradiation step, includes helium or neon.

10. The impurity introducing method as set forth in claim 1, wherein gas seed, which is used in the second plasma irradiation step, includes at least one of a group comprising Ar, Kr, Xe, and Rn.

* * * * *

UNITED STATES PATENT AND TRADEMARK OFFICE
CERTIFICATE OF CORRECTION

| | |
|---|---|
| PATENT NO. | : 7,456,085 B2 |
| APPLICATION NO. | : 10/597716 |
| DATED | : November 25, 2008 |
| INVENTOR(S) | : Yuichiro Sasaki et al. |

Page 1 of 1

It is certified that error appears in the above-identified patent and that said Letters Patent is hereby corrected as shown below:

Column 10, line 4 please delete "a", please insert --as--.

Signed and Sealed this

Twenty-fourth Day of March, 2009

JOHN DOLL
*Acting Director of the United States Patent and Trademark Office*